(12) United States Patent
Gotoh et al.

(10) Patent No.: US 6,204,454 B1
(45) Date of Patent: Mar. 20, 2001

(54) WIRING BOARD AND PROCESS FOR THE PRODUCTION THEREOF

(75) Inventors: Masashi Gotoh; Jitsuo Kanazawa, both of Ibaraki; Syuichiro Yamamoto, Chiba, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/221,124

(22) Filed: Dec. 28, 1998

(30) Foreign Application Priority Data

Dec. 27, 1997 (JP) ................................. 9-368027
Dec. 27, 1997 (JP) ................................. 9-368035

(51) Int. Cl.[7] ................. H05K 3/22; H05K 3/28
(52) U.S. Cl. ........... 174/255; 174/52.4; 174/256; 174/257; 174/259; 174/260; 361/748; 361/760; 361/768; 361/782; 361/783; 257/704; 257/739; 310/348; 29/846; 438/118; 427/96; 428/209; 156/153; 216/52
(58) Field of Search ............... 361/748–751, 361/760, 765, 766–768, 771–774, 777, 782, 783, 792, 795; 257/667, 678, 692, 693, 700–704, 739, 778, 783, 787, 788; 174/250, 253–260, 52.3, 52.4; 29/830–832, 840, 841, 846, 855; 438/108, 118, 124, 126, 127, 665; 427/70, 96; 428/209, 210, 901; 156/153, 295; 216/13, 16, 17, 19, 20, 33, 34, 36, 52; 310/348

(56) References Cited

U.S. PATENT DOCUMENTS

| | | | |
|---|---|---|---|
| 4,151,543 | * | 4/1979 | Hayakawa et al. ............... 257/739 |
| 4,376,287 | * | 3/1983 | Sechi ............................... 29/832 |
| 4,628,598 | * | 12/1986 | Taylor .............................. 29/846 |
| 5,278,429 | * | 1/1994 | Takenaka et al. ................ 257/704 |
| 5,362,926 | * | 11/1994 | Fukuda et al. ................... 174/256 |
| 5,545,589 | * | 8/1996 | Tomura et al. .................. 438/665 |
| 5,741,575 | * | 4/1998 | Asai et al. ....................... 428/209 |
| 5,949,655 | * | 9/1999 | Glenn .............................. 361/783 |

FOREIGN PATENT DOCUMENTS

| | | |
|---|---|---|
| 0 434 392 | 6/1991 | (EP) . |
| 59-74652 | 4/1984 | (JP) . |
| 60-21544 | 2/1985 | (JP) . |
| 61-30057 | 2/1986 | (JP) . |
| 4-116852 | 4/1992 | (JP) . |
| 6-112363 | 4/1994 | (JP) . |
| WO 95/19644 | 7/1995 | (WO) . |

* cited by examiner

Primary Examiner—Jaypprakash N. Gandhi
Assistant Examiner—John B. Vigushin
(74) Attorney, Agent, or Firm—Oblon, Spivak, McClelland, Maier & Neustadt, P.C (57) ABSTRACT

A wiring board having a conductor layer formed on a substrate and a connecting pad disposed in a connecting pad disposition portion provided in part of the conductor layer surface, the conductor layer having a resin inflow prevention portion which is provided adjacently to the said connecting pad disposition portion and which has a surface roughness greater than the surface roughness of the said connecting pad disposition portion, the resin inflow prevention portion being capable of overcoming the problem of prior art that an adhesive resin (resin layer) of a prepreg or an adhesive flows out onto the upper surface of the pad, due to its softening under heat and its being pressurized for bonding when a structure member such as a cover layer is bonded to the wiring board, and forms a cured resin which extremely inhibits the bonding property of a chip element onto the pad.

13 Claims, 9 Drawing Sheets

WIRING BOARD AND PROCESS FOR THE PRODUCTION THEREOF

BACKGROUND OF THE INVENTION

1. Field of the Invention

The present invention relates to a wiring board suitable for mounting electronic parts such as various chip elements and a process for the production thereof.

2. Background Art

Electronic hardware has been increasingly embodying lightness, thinness, compactness and smallness, and a resistor, a coil, a condenser and others such as a semiconductor, an SAW element, a sensor, etc., are formed as chips. And, recently, there are widely used surface mounting techniques of mounting chip elements directly on the surface of a wiring board like a COB (chip-on-board) structure.

A wiring board formed of a resin in particular is easily produced by molding and is excellently inexpensive, and such wiring boards are laminated and bonded to be used as a container for an electronic part. A wiring board and a container for an electronic part have come to be substantially not distinct from each other.

A conventional wiring board will be explained below.

Figure 7:
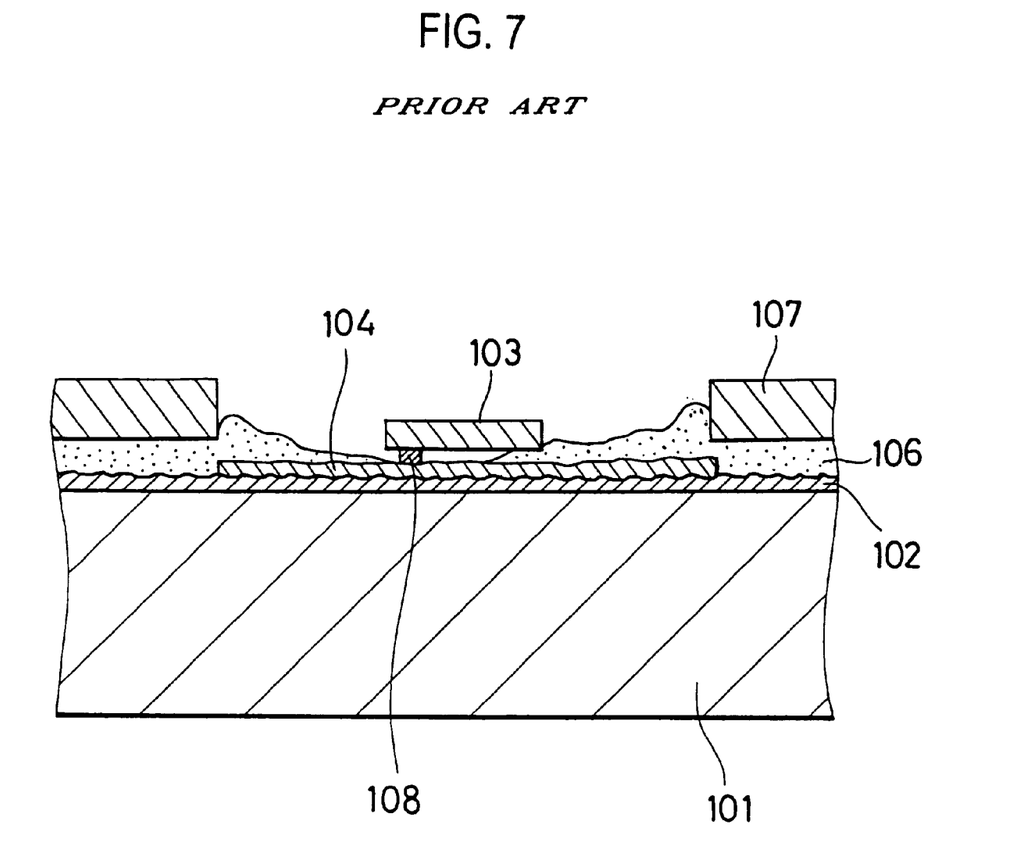
FIG. 7 is a cross-sectional view of structure of a conventional wiring board on the surface of which a chip element is mounted.

FIG. 7 is a cross-sectional view of a conventional wiring board for showing a structure in which a pad on which a chip element is to mounted, i.e., a pad for connecting an electronic part, is formed on an upper surface. A conductor layer 102 formed of a copper foil and a copper plating layer coated on the copper foil is laminated on the upper surface of a substrate 101 formed of an epoxy resin or a BT resin, and a pad 104 on which a chip element 103 is to be mounted and bonded is formed on part of the upper surface of the conductor layer 102. The entire upper surface of the conductor layer 102, including that upper surface of the conductor layer 102 which is to constitute an under layer of the pad 104, is a surface from which an oxide layer is removed and which is roughened with a scrubber, etc., so as to have a surface roughness of approximately 0.3 to 0.5 μm for easy bonding of a resin layer 106 such as a prepreg or a resist to the upper surface of the conductor layer 102 by an anchor effect.

A bump 108 of the chip element 103 is attached to the pad 104, and the pad 104 and the bump 108 are electrically connected to each other by means of ultrasonic wave, an electrically conductive adhesive or soldering. The upper surface of the pad 104 is therefore required to be flat. Therefore, a nickel layer having a thickness of approximately 5 to 10 μm is laminated on the conductor layer 102, and then, a metal layer having a thickness of 0.5 to 3 μm is stacked thereon, to constitute the pad 104 formed of a plurality of these plating layers.

In many cases, further, as shown in FIG. 7, the mounted chip element is sealed and protected by attaching and laminating an approximately 0.5 to 1.0 mm thick cover layer 107 formed of an epoxy resin or a BT resin on an upper surface of the conductor layer 102. In this instance, the cover layer 107 is placed on the wiring board through the resin layer 106, and it is laminated and bonded by heating under pressure. The resin layer 106 is a layer used for bonding by providing a bonding prepreg having a thickness of approximately 0.05 to 0.1 mm, heating the prepreg to allow it easily flow so that it flows over bonding surfaces, and applying a pressure to promote the flowability and fully adapt it to the bonding surfaces.

In some cases, an ink is used to print characters, symbols, etc., in the position of the above resin layer 106.

For further accomplishing a lighter, thinner and smaller electronic machine or device, a wiring board is required which permits, for example, highly accurate face-down mounting on the scale of micron units, and it comes to be essential to make the occupation area of the pad on the wiring board as small as possible for attaining the high-density mounting of parts and the downsizing of the wiring board.

Figure 8:
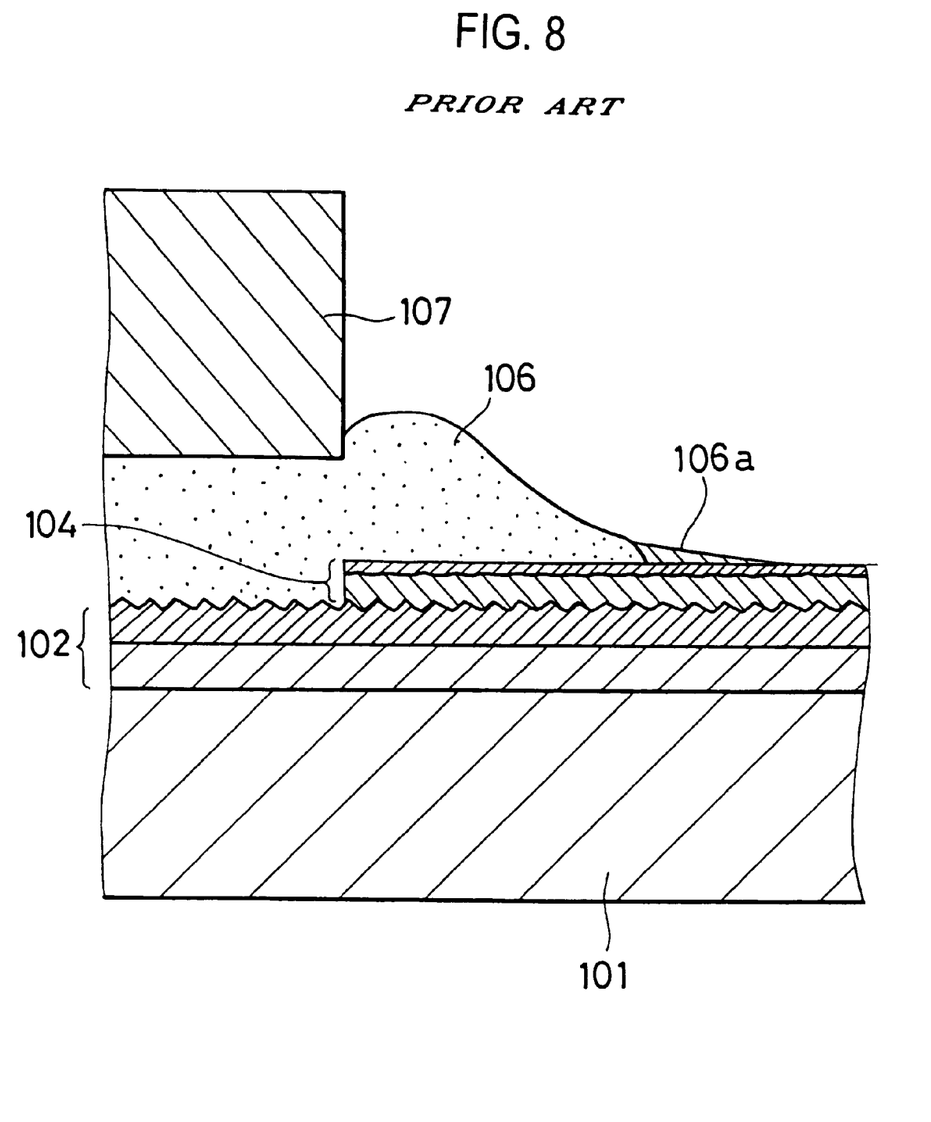
FIG. 8 is a cross-sectional view of a main portion of the conventional wiring board shown in FIG. 7.

Concerning the above demand, the above prior art involves a problem that it is not possible to minimize the area of the pad to a necessary limit. When a structure member such as the cover layer is laminated on and bonded to the wiring board, an adhesive resin of a prepreg or an adhesive (resin layer) is softened under heat and pressurized for bonding, to flow over to an upper surface of the pad. FIG. 8 is a cross-sectional view of an essential portion showing the flowing of a prepreg over onto an upper surface of the pad due to the softening of the prepreg under heat during bonding. On the clean and flat upper surface of the pad, the resin is easily spread, and a highly flowable component 106a contained in the resin is mostly transparent, so that the component 106a is difficult to recognize even if it is spread over the pad. Moreover, a film of the resin cured on the pad extremely impairs a bonding capability. Otherwise, when a chip element is already bonded, the above resin may flow onto the bump of the chip element or the chip element itself, and the functions thereof, i.e., the connecting function or the chip element characteristics may be inhibited. According to prior art, therefore, the pad is generally required to have greater dimensions than the chip element for reliable bonding to secure a resin-flow tab by taking account of safety, and the pad is required to be broader than necessary as compared with the size of the chip element, which has resulted in a large size of the wiring board. When the pad has a small size, the distance between the outer circumferential portion thereof, i.e., the outer circumference of the pad and the inner circumference of the resin layer is required to be sufficiently large in order to avoid the flowing of the component which flows out from the resin layer onto the bump of the chip element and the chip element itself, and as a result, it has been difficult to further downsize the wiring board.

Further, according to the prior art, the entire upper surface of the conductor layer is roughened by treatment with a scrubber like roughening by scraping with a wire brush. The above conventional roughened surface has a roughness which is not only non-uniform in depth but also is in the state of unidirectionally leaned scratches, and the roughened surface neither has necessarily good adhesion to the above resin layer such as a prepreg or an adhesive nor has sufficient capability of fitting to a cover, and the like.

Furthermore, the above directionally roughened surface formed by physical treatment exhibits the function of preventing the flow of a certain quantity of a resin in the direction at right angles with the direction in which grooves formed by the roughening extends, while it exhibits almost no function of preventing the flow of a resin in the direction in parallel with the direction in which the grooves extend.

In general, conventional wiring boards have a problem that they cannot comply with demands of the lightness, thinness, compactness and smallness of different electronic machines and devices.

SUMMARY OF THE INVENTION

It is an object of the present invention to provide a highly accurate wiring board suitable for mounting electronic parts in a high density by overcoming the problems which the above prior art has left unsolved.

It is another object of the present invention to provide a process for the production of a wiring board, which enables the production of micro-processed highly accurate wiring boards in simplified steps.

The above object is achieved by the present invention specified below.

(1) A wiring board having a conductor layer formed on a substrate and a connecting pad disposed in a connecting pad disposition portion provided in part of the conductor layer surface, a resin inflow prevention portion being provided adjacently to the said connecting pad disposition portion of the conductor layer, the resin inflow prevention portion having a surface roughness greater than the surface roughness of the said connecting pad disposition portion.

(2) A wiring board according to the above (1), wherein a resin layer formation portion is provided adjacently to the said resin inflow prevention portion of the conductor layer, and the resin layer formation portion has a surface which is nearly the same as the resin inflow prevention portion in surface state.

(3) A wiring board according to the above (1), wherein the said connecting pad disposition portion of the conductor layer and a surface of the other portion of the conductor layer are nearly on the same level.

(4) A wiring board according to the above (2), wherein the connecting pad disposition portion of the conductor layer has a physically roughened surface and at least the resin inflow prevention portion of the resin inflow prevention portion and the resin layer formation portion has a chemically roughened surface.

(5) A wiring board according to any one of the above (1) to (4), wherein an electronic part which involves mechanical vibration is mounted on the said connecting pad.

(6) A wiring board having a conductor layer formed on a substrate, a connecting pad disposed in a connecting pad disposition portion provided in part of the conductor layer surface and a coating layer formed on a surface around the connecting pad disposition portion of the conductor layer, a resin inflow prevention portion being provided on the coating layer adjacently to the said connecting pad disposition portion of the conductor layer, the resin inflow prevention portion having a surface roughness greater than the surface roughness of the said connecting pad disposition portion.

(7) A wiring board according to the above (6), wherein a resin layer formation portion is provided adjacently to the resin inflow prevention portion on the coating layer, and the resin layer formation portion has a surface which is nearly the same as the corresponding resin inflow prevention portion in surface state.

(8) A wiring board according to the above (6), wherein the connecting pad disposition portion of the conductor layer has a physically roughened surface and at least the resin inflow prevention portion of the resin inflow prevention portion and the resin layer formation portion has a chemically roughened surface.

(9) A wiring board according to any one of the above (6) to (8), wherein an electronic part which involves mechanical vibration is mounted on the said connecting pad.

(10) A process for the production of a wiring board having a conductor layer formed on a substrate and a connecting pad formed of a plating layer on part of the conductor layer, the process comprising a pad formation step of selecting a metal which can work as an etching resist when the conductor layer is chemically surface-roughened, and metal-plating part of the upper surface of the conductor layer to form at least the uppermost portion of the connecting pad with the selected metal, and a chemical surface roughening step of chemically roughening the connecting-pad-non-coated upper surface of the conductor layer with using the connecting pad as an etching resist, to form an upper surface having a higher roughness than the connecting-pad-coated upper surface of the conductor layer on conductor layer around the pad.

(11) A process according to the above (10), wherein the conductor layer is formed of copper and the metal forming at least the uppermost portion of the connecting pad is gold.

(12) A process for the production of a wiring board having a conductor layer formed on a substrate, a connecting pad formed of a plating layer on part of the conductor layer and a coating layer formed around the connecting pad on the conductor layer, the process comprising a pad formation step of selecting a metal which is not surface-roughened by means of chemically surface-roughening the coating layer when the conductor layer is chemically surface-roughened, and metal-plating part of the upper surface of the conductor layer to form least the uppermost portion of the connecting pad with the selected metal, and a chemical surface roughening step of chemically roughening the upper surface of the coating layer, to form an upper surface having a higher roughness than the connecting-pad-coated upper surface of the conductor layer on conductor layer around the pad.

(13) A process according to the above (12), wherein the conductor layer is formed of copper and the metal forming at least the uppermost portion of the connecting pad is gold.

DETAILED DESCRIPTION OF THE INVENTION

The wiring board of the present invention has the following first function/effect. A resin inflow prevention portion having a large surface roughness is formed adjacently to a connecting pad disposition portion of a conductor layer where a connecting pad to which an electronic part or the like is connected is formed. Therefore, an easily flowable resin component which flows out from a resin layer, etc., disposed around the resin inflow prevention portion is retained in a convex portion of the above resin inflow prevention portion formed by increasing the surface roughness, so that the further flowing of the component is prevented and that no bad effect is caused on the electronic part, etc., disposed on the above connecting pad. In other words, the formation of the above resin inflow prevention portion serves to decrease the distance (inflow tab) between the electronic part, etc., disposed on the connecting pad and the resin layer such as a prepreg, so that the wiring board can be downsized.

Further, there is a second function/effect that when a cover, or the like, is fitted in a surrounding portion having a large surface roughness on the conductor layer with the above resin layer such as a prepreg or an adhesive, the resin layer and the above surrounding portion bond to each other more excellently, so that the excellent fitting of the cover, etc., is attained. In this case, naturally, it is required to form the above resin inflow prevention portion in advance by providing a distance having a predetermined width between the inner circumferential portion of the above resin layer and the outer circumferential portion of the pad.

The above-explained first and second functions/effects are remarkably produced when the above roughening is chemically carried, e.g., carried out by chemical soft etching. The chemical surface-roughening gives a larger surface roughness than the above physical surface-roughening, and the distribution of concave and convex shapes formed by the roughening is random in all the directions on the surface, so that the inflow of a resin from all the directions can be prevented and that the strength of bonding to the resin is improved in uniformity.

In the present invention, further, portions around the pad can be surface-roughened in a separate step, and the connecting pad disposition portion of the above wiring board can have a surface roughness which is as small as the surface roughness which is attained by removing an oxide, so that the connecting pad to be formed thereon by plating can be formed so as to have a flat surface even if it has a small thickness, which is economical and improves the connection to electronic part, etc., in stability. Naturally, the above functions and effects are also similarly produced even when a surface other than the pad is formed of a coating layer.

Meanwhile, when the above-constituted wiring board of the present invention is formed according to a conventional method, it is presumably produced by the following steps.

Figure 9A:
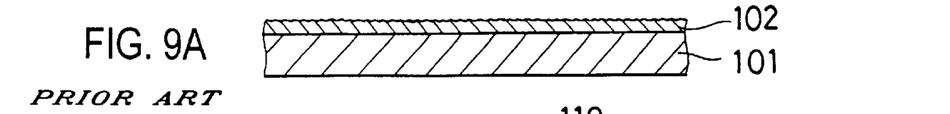
FIGS. 9A to 9H show steps of producing the wiring board having the structure shown in FIG. 7 according to a conventional method.
Figure 9B:
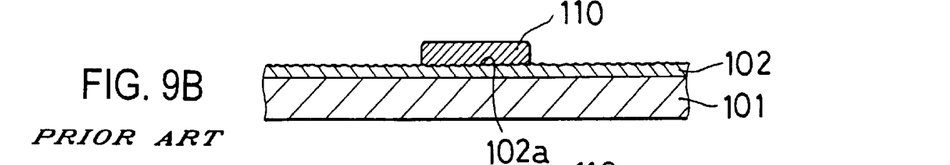
Figure 9C:
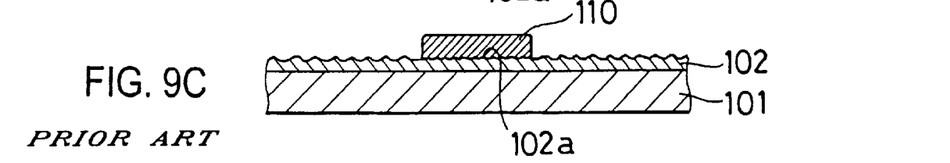
Figure 9D:
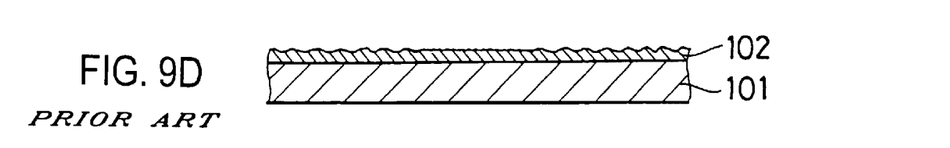

In FIG. 9, the entire upper surface of a conductor layer 102 on a substrate 101 is physically roughened with a scrubber, etc., (FIG. 9A), then, a connecting pad portion 102a is covered with an etching resist 110 (FIG. 9B), and the conductor layer surface which is not covered with the etching resist is etched to form a roughened surface (FIG. 9C). The etching resist is removed (FIG. 9D), then, a plating resist 112 is covered on the roughened conductor layer surface (FIG. 9E), and a plating layer is deposited on the conductor layer upper surface which is not covered with the plating resist, i.e., the connecting pad disposition portion 102a, to form a connecting pad 104 (FIG. 9F). Then, the plating resist is removed to complete the steps.

However, the production of a wiring board having the constitution of the present invention in the above steps has the following problem.

Figure 9E:
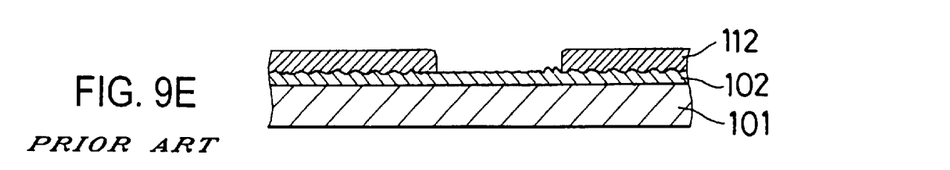
Figure 9F:
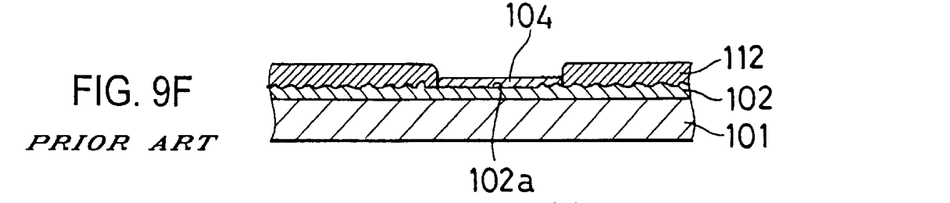
Figure 9G:
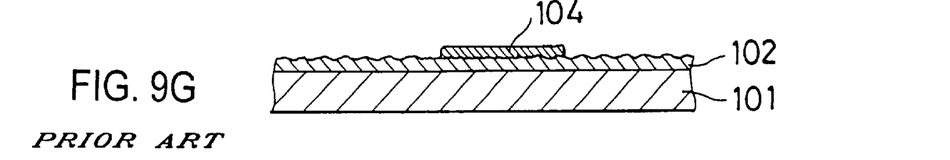
Figure 9H:
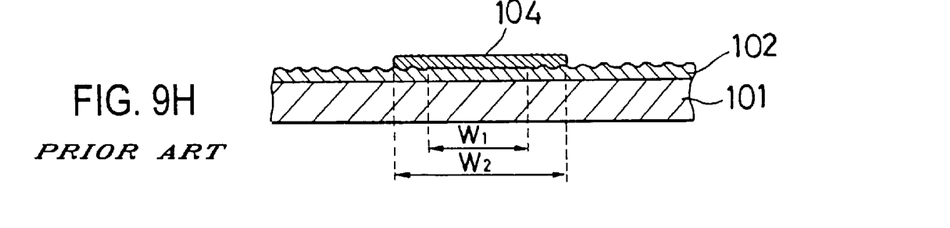

According to the method in which the plating resist is used after the etching resist is used, it is required to carry out a photolithographic step twice. Conventionally, therefore, it is required to provide a useless space needed as a tolerance for mask registering. As a result, the area for plating required for the pad is greater than the area essentially required for bonding, and the pad is increased in size. That is, when a deviation in masking with the plating resist as shown in FIG. 9E and thereafter is taken account of, it is required to broaden a pad to a width W2 for reliably securing a necessary pad width W1 as shown in FIG. 9H.

That is, the above method has a problem that there cannot be provided any micro-processed highly accurate wiring board.

According to the production process of the present invention, part of the upper surface of the conductor layer is covered with a metal plating layer which is to form the pad, and then the conductor layer upper surface which is not covered with the metal plating layer is chemically roughened with using the metal plating layer as a mask, for forming a resin inflow prevention portion, etc., so that a highly accurate wiring board can be provided.

According to the present invention, further, while a coating layer such as a resist provided for forming the pad is retained, the pad is used as something like an etching resist, and the upper surface of the coating layer is chemically roughened for forming the resin inflow prevention portion, etc., so that a highly accurate wiring board can be provided.

That is, according to the production process of the present invention, the pad is used directly as an etching resist, W2 as shown in FIG. 9H is no longer necessary as a pad width, and the substantial width W1 can be maintained, which results in the use of a further downsized wiring board.

The present invention will be explained with reference to drawing hereinafter.

Figure 1:
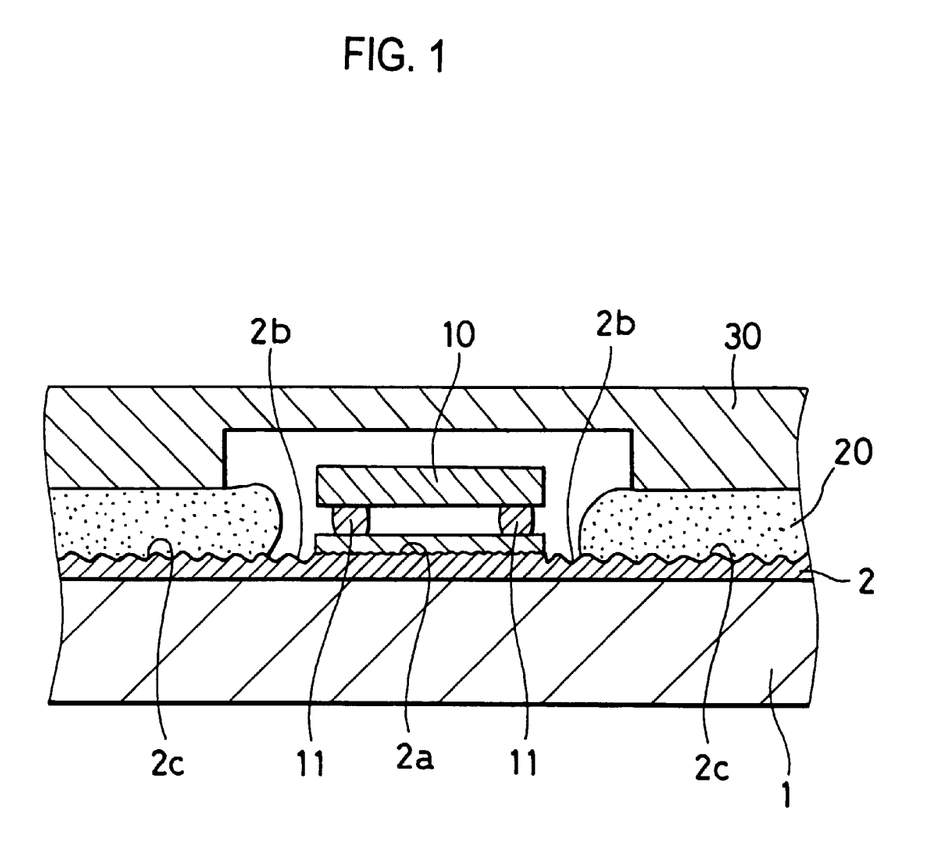
FIG. 1 is a cross-sectional view of one example of structure of the wiring board of the present invention on the surface of which a chip element is mounted.
Figure 2:
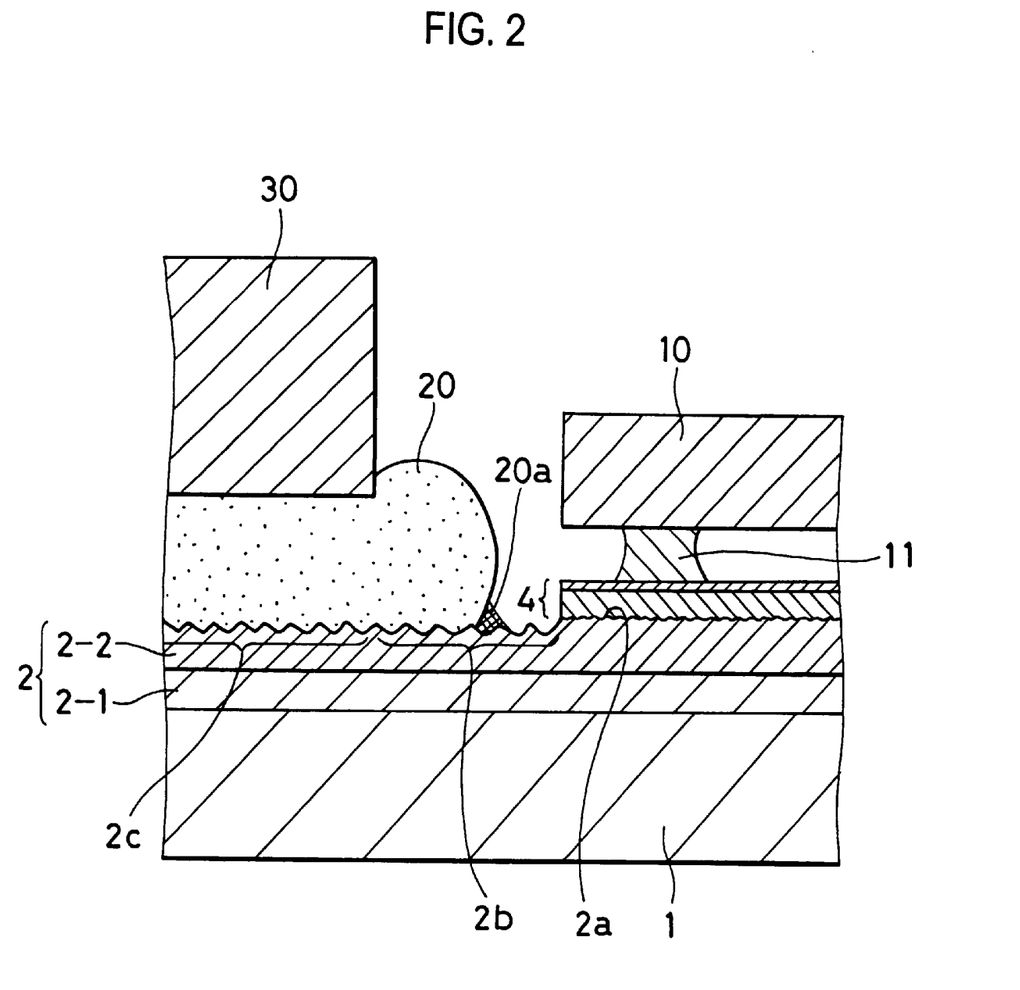
FIG. 2 is a cross-sectional view of a main portion of the wiring board of the present invention shown in FIG. 1.

FIG. 1 is a cross-sectional view showing a structure of the wiring board of the present invention. A conductor layer 2 is formed on a substrate 1. The above substrate 1 is formed, e.g., of an epoxy resin or a BT resin as described above, the thickness thereof is preferably approximately 0.1 to 1.6 mm, more preferably approximately 0.2 to 0.8 mm, particularly preferably approximately 0.3 to 0.5 mm. The above conductor layer 2 is preferably formed of copper or the like. As the conductor layer 2, conventionally, a structure formed by providing a copper plating layer 2-2 on a copper foil 2-1 as shown in FIG. 2 is generally used. The thickness of the above copper foil 2-1 is preferably approximately 9 to 35 $\mu$m, particularly preferably approximately 12 to 18 $\mu$m, and the thickness of the copper plating layer is preferably approximately 3 to 25 $\mu$m, particularly preferably approximately 5 to 20 $\mu$m. The copper plating layer works to flatten the surface.

A connecting pad disposition portion 2a is provided in a predetermined part on the upper surface of the above conductor layer 2. On the connecting pad disposition portion 2a of the conductor layer, a connecting pad 4 (to be sometimes simply referred to as "pad" hereinafter) for mounting and connecting an electronic part such as a chip element is formed. The pad 4 is generally formed of at least two plating layers, e.g., a nickel plating layer as an under-coating layer and a gold plating layer as a surface layer formed thereon. In the pad 4, preferably, the above under-coating layer is 3 to 10 $\mu$m thick, the surface layer is 0.1 to 3 $\mu$m thick, and the total thickness of the pad 4 is approximately 4 to 13 $\mu$m. The pad 4 may be also formed of a solder plating (solder leveler), a tin plating, a silver plating, or the like, and the material for the pad 4 is determined depending upon means of connection to a chip element. Although differing depending upon the size of an electronic part, the size (area) of the above connecting pad disposition portion 2a, i.e., the pad 4, can be approximately 70 to 130% of the size of an electronic part.

For easing the formation of the pad of the above plating layers, the above connecting pad disposition portion 2a is preferably a portion which is treated so as to remove its surface layer mainly for the purpose of removing an oxide layer formed thereon. Preferably, the treatment for the removal of the surface layer is physically carried out, and it is preferably carried out with a scrubber or a jet scrub. In this case, the connecting pad disposition portion 2a has a physically roughened surface having a surface roughness of approximately 0.3 to 0.5. In the present specification, it should be understood that the conductor layer does not include the above pad.

In a surrounding portion which is on the same level as the level of and continued to, and abuts on, the connecting pad disposition portion 2a of the above conductor layer 2, a resin inflow prevention portion 2b having a predetermined width is formed for preventing the flowing of a highly flowable component of a prepreg, etc., into a chip element region on the pad. The width of the resin inflow prevention portion 2b is preferably approximately 0.1 to 0.5 mm. The surface of the resin inflow prevention portion 2b is roughened to have a surface roughness greater than the surface roughness of the above connecting pad disposition portion 2a. Specifically, the surface thereof is preferably a chemically roughened surface having a surface roughness of 0.5 to 10 $\mu$m, particularly preferably approximately 1 to 5 $\mu$m. When the above surface roughness is less than 0.5 $\mu$m, the resin inflow prevention effect is not sufficient. When the roughening is carried out to excess, not only processing (chemical processing in particular) is difficult, but also an edge of a through-hole formed in the wiring board may break.

Figure 3:
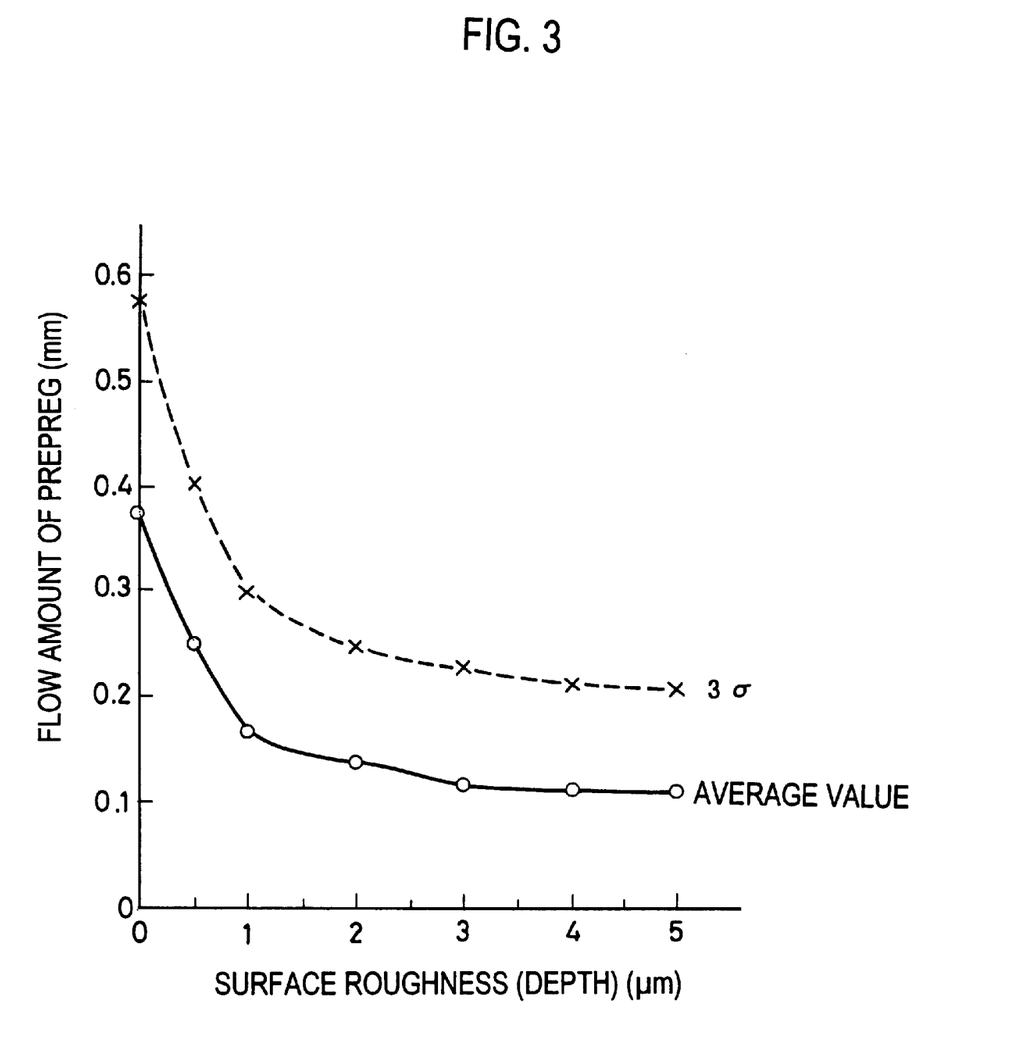
FIG. 3 is a graph showing the relationship between a surface roughness and the flow amount of a prepreg.

The width and the surface roughness of the above resin inflow prevention portion have been determined by carrying out the following experiment. Samples having surfaces equivalent to the surface of the conductor layer 2 were adjusted with MECetchBOND CZ-8100 to be described later, supplied by Mec Co., Ltd., so as to have a surface roughness of 0.5, 1, 2, 3, 4 or 5 $\mu$m. A prepreg was bonded onto each sample under heat, and each sample was measured for an amount of resin which flowed out therefrom. Specifically, a 60 $\mu$m thick BT resin was used as a prepreg, it was heated at 200° C. for 2 hours under a pressure of 30 kg/cm$^2$, and it was measured how the flow amount of the prepreg varied depending upon the degrees of roughness of the sample surfaces. Graphs in FIG. 3 show the results. In FIG. 3, a solid line shows average values of flow amounts, and a dotted line shows upper limit values (average value +3σ) of 3σ of the flow amounts. As shown by the graphs in FIG. 3, the flow amount of the prepreg is controlled to be an average of 0.17 mm or less, and the upper limit value of 3σ is controlled to be 0.3 mm or less, by adjusting the surface roughness to at least 1 $\mu$m, and it is seen that the present invention produced an effect that the flow amount can be remarkably controlled by simply roughening so as to form a roughness of as small as 1 $\mu$m. On the basis of the foregoing, it is determined that the width and the surface roughness of the above resin inflow prevention portion 2b are preferably in the above-specified ranges.

Preferably, the above resin inflow prevention portion 2b is surface-roughened by a chemical treatment, e.g., chemical soft etching, concave and convex shapes are randomly disposed, and when an average of predetermined areas is calculated, any surface portion is similarly roughened. The soft etching as used herein refers to an etching in which the rate of etching copper is low as compared with the etching of ferric chloride and the etching amount can be controlled on the basis of a time period.

The above soft etching is carried out, for example, by heating MECetchBOND CZ-8100 supplied by Mec Co., Ltd. up to 20 to 40° C., spraying it to a surface to be etched at a pressure of 0.5 to 3 kg/cm$^2$, washing the etched surface with pure water with a pressure sprayer at 0.5 to 3 kg/cm$^2$ for about 1 minute, washing it with an acid such as 2 to 5 wt % hydrochloric acid, washing it with pure water at three stages and drying it with an air knife and a spin dryer.

In the above resin inflow prevention portion 2b, preferably, the line length of cross section of the roughened surface (when the surface roughness is 1 to 5 $\mu$m) is 4.5 to 9 times as large as a predetermined horizontal distance, and the line length is in the above range when the cross section is taken in any direction and in any portion. Specifically, when a soft etching is carried out using MECetchBOND CZ-8100 supplied by Mec Co., Ltd. under the above conditions to obtain a surface roughness of 2.8 $\mu$m, the line length of cross section of a roughened surface in a horizontal distance of 20 $\mu$m is 152 $\mu$m, which value is 7.6 times as large. The line length of cross section of a roughened surface can be measured, e.g., with a surface form measuring apparatus VF-7500 supplied by Keyence Co., Ltd. In contrast, when the above roughening is carried out with a belt sander (scrubber) and when a surface roughness of 1 to 3 $\mu$m is obtained, the above value is 3 to 6.5 times as large in one direction, while it is approximately 1.0 to 1.3 times as large in the direction at right angles with the above direction. In this sense, the surface of the above resin inflow prevention portion 2b is preferably a surface which is chemically roughened. However, when the above resin inflow prevention portion 2b has dimensions different between a vertical direction and a horizontal direction, and when one direction is dimensionally sufficient, even a physically roughened surface has an effect depending upon the arrangement of direction of the roughened surface.

Outside the resin inflow prevention portion 2b of the conductor layer 2, a resin layer formation portion 2c on which a resin layer 20 such as a prepreg is formed is provided so as to be continued thereto on the same level as the level thereof. Preferably, the resin layer formation portion 2c has a surface roughness equivalent to the surface roughness of the above resin inflow prevention portion 2b. The resin layer formation portion 2c can be surface-roughened by soft etching simultaneously with the surface roughening of the above resin inflow prevention portion 2b.

On the pad 4 of the above-constituted wiring board, a chip element 10 such as a resistor, a coil, a condenser, a semiconductor, an SAW or sensor is bonded through a bump 11 to be connected and mounted. The wiring board of the present invention particularly produces its remarkable effect when the chip element 10 is an electronic part which involves mechanical vibration such as an SAW element, a piezo-electric transducer, or the like. That is, for example, an SAW element uses the surface acoustic wave characteristic of a piezo-electric material. When a prepreg, or the like is in contact with the SAW element, the characteristic of the element is greatly impaired. According to the present invention, even when a cover is sealed with a prepreg, the flow of the prepreg is blocked with the roughened surface of the above resin inflow prevention portion, and no prepreg flows onto the pad, so that a container for housing the SAW element can be downsized in outer shape and that a highly reliable SAW device can be provided.

The above pad can be used as a pad for wire bonding. The above bonding is generally carried out by ultrasonic bonding or with an electrically conductive adhesive or a solder.

On the above resin layer formation portion 2c of the above conductor layer 2, a marginal portion of a fitting member 30 such as a cover layer or a cover is bonded through a prepreg 20, and the above electronic part is sealed in a space inside the fitting member 30, e.g., a cover. In this case, the prepreg 20 is a resin layer formed on the resin layer formation portion 2c.

In the sealing step using the above prepreg 20, the prepreg 20 is heated, and this time, a highly flowable component 20a which flows out of the prepreg 20 is retained in the above resin inflow prevention portion and the flowing thereof into the above pad 4 portion is prevented (see FIG. 2). The above resin layer includes the above prepreg and others such as an adhesive, a resist, a surface protecting agent, a heat-conductive paste and an ink. The above resin layer contains a resin, a solvent component and a vehicle component which have relatively low molecular weight and characteristically spread over on a flat plating surface. In the present invention, a roughened surface for inhibiting the flowing thereof is provided around the pad, for preventing the spreading of the above flowable components onto an upper surface of the pad which is a plating layer, and the present invention can be applied not only to Examples to be described later but also to a variety of cases.

Figure 4:
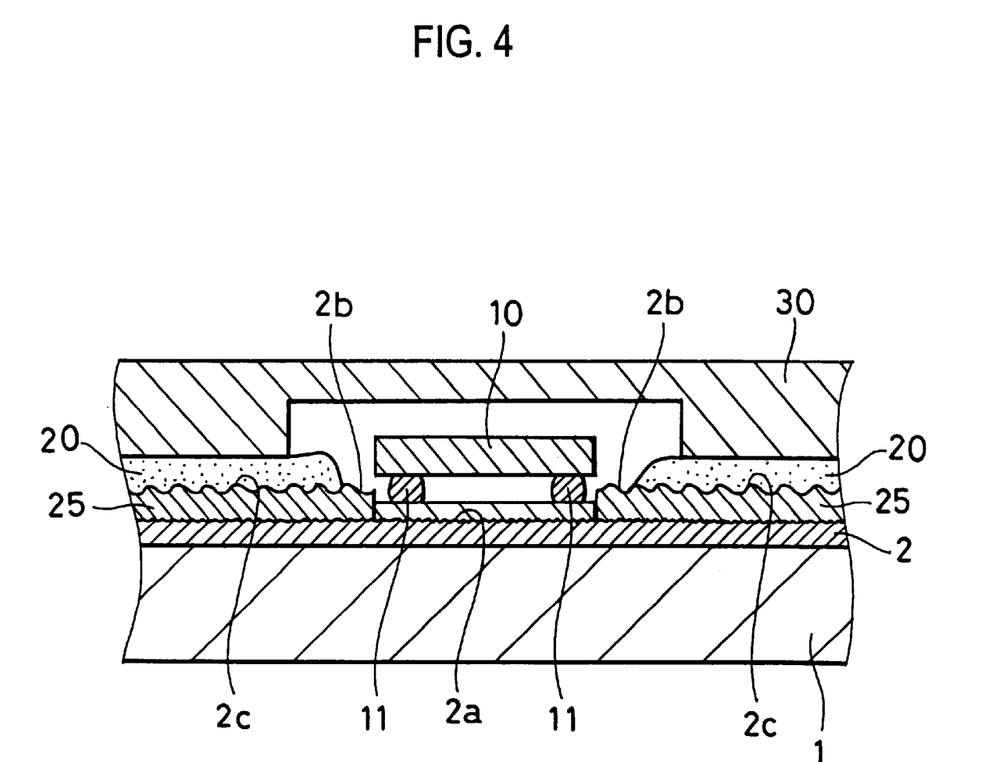
FIG. 4 is a cross-sectional view of other example of structure of the wiring board of the present invention.

As shown in FIG. 4, further, a coating layer 25 such as a plating resist layer is formed on the surface of a portion other than the pad 4 on the upper surface of the conductor layer 2 on the substrate 1, and the upper surface of the coating layer 25 roughened in the same manner as in the formation of the resin inflow prevention portion 2b of the above conductor layer 2, whereby the coating layer can be imparted with the same function that the above surface-roughened conductor layer has. According to this variant, for example, the upper layer of a plating resist as a coating layer is roughened, and the fitting member 30 such as a cover, or the like can be laminated on, and bonded to, the plating resist through the prepreg 20. In the above variant, a plating resist is applied, a plating which is to form a pad is provided, and then the surface of the plating resist can be chemically roughened with an alkali solution without corroding the pad. In this method, the resin layer such as a plating resist is used as a permanent resist, so that the production process of a wiring board can be simplified. Further, since the concave and convex portion of the wiring board is filled with a permanent resist, a flatness can be secured.

The resin for forming the above coating layer is mainly selected from epoxy, acrylic, polyimide, urethane and phenolic resins.

When the surface of the coating layer on the conductor layer is used as a resin inflow prevention portion as described above, a resin layer such as a plating resist can be used as a permanent resist, and the steps of producing the wiring board can be simplified. Further, since the concave and convex portion of the wiring board is filled with the permanent resist, a flatness can be secured.

Further, the resist surface is abraded by surface roughening for forming the resin inflow prevention portion, and a highly adhesive filler component contained in the resist is therefore exposed, so that the resin of the resin layer is improved in adhesion. When a seal is printed on a bonding layer formation portion, a seal-printing agent is improved in adhesion, and the durability against washing is also remarkably improved.

The effect of the present invention will be explained in detail with reference to FIG. 2 hereinafter.

FIG. 2 is a cross-sectional view of a main portion for explaining a particular portion of structure of the wiring board of the present invention shown in FIG. 1. The fitting member 30 is strongly bonded onto the conductor layer 2 due to the anchor effect of the prepreg 20 since the upper surface of the resin layer formation portion 2c of the conductor layer 2 is roughened preferably chemically. Further, in the roughened surface of the resin inflow prevention portion 2b of the conductor layer 2 exposed around the plating layer forming the pad 4, the concave and convex shape of the roughened surface inhibits the outflow of the highly flowable component contained in an adhesive resin such as a prepreg or a resist and prevents the flowing of a resin onto the upper surface of the pad. As a result, the distance between the above chip element 10 and the prepreg 20 can be decreased as compared with the counterpart of a conventional example, so that the wiring board can be downsized.

FIG. 5 explains the process for the production of the wiring board of the present invention.

The upper surface of the conductor layer 2, such as a copper foil, laminated on the substrate 1 is formed as a flat surface by plating copper after a through-hole as required. A circuit pattern having a desired form is formed in the conductor layer 2 by a tinting method, or the like (see FIG. 5A).

Figure 5A:
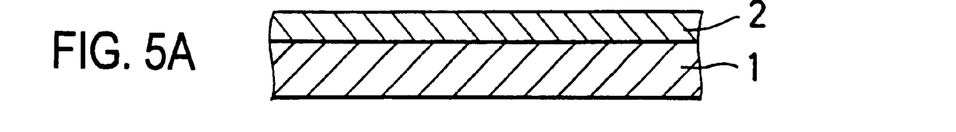
FIGS. 5A to 5F show the process for the production of the wiring board of the present invention shown in FIG. 1.
Figure 5B:
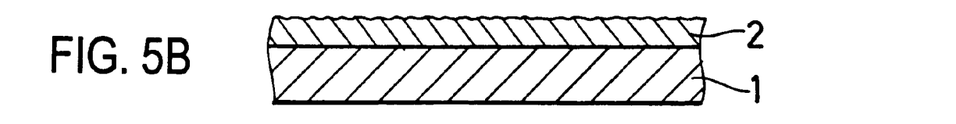

The entire upper surface of the conductor layer 2 on the substrate 1 is physically roughened preferably with a scrubber (FIG. 5B). In the present invention, the above surface-roughening can be carried out to such an extent that an oxide layer on the conductor layer is removed. Preferably, the upper surface of the surface-roughened conductor layer 2 has a surface roughness of approximately 0.3 to 0.5 $\mu$m. In a conventional surface roughening, an oxide layer on the conductor layer is removed, and further, when the bonding of the above prepreg, etc., is intended, the roughening is carried out to a greater extent in some cases for obtaining an anchor effect. In the present invention, the surface is roughened to such an extent that an oxide layer is removed, since the surface roughening for obtaining an anchor effect for the above prepreg, etc., is separately carried out later. The degree of the surface roughening in the present invention can be therefore decreased as described above. In this sense, the above step may be carried out by any means so long as the above oxide layer can be removed.

Figure 5C:
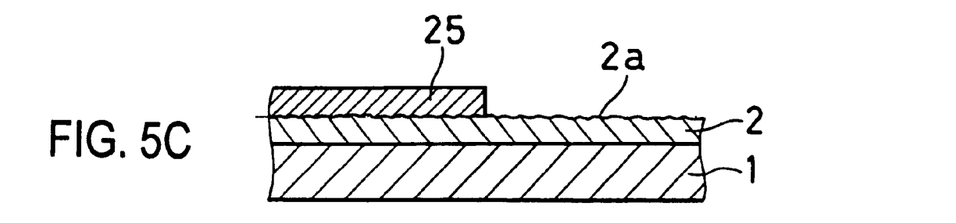
Figure 5D:
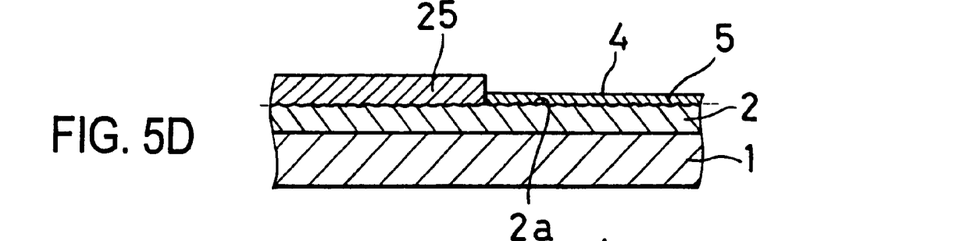
Figure 5E:
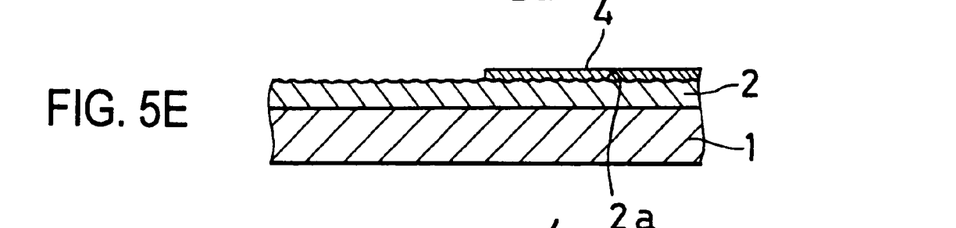

A plating resist 25 is applied to the upper surface of the conductor layer 2 excluding the connecting pad disposition portion 2a which is to constitute a region where the pad is formed (see FIG. 5C). The plating resist is a dry film or a liquid photosensitive resin, and by exposure and development, the plating resist is left on a portion which is not required to be plated.

Then, on the upper surface of the connecting pad disposition portion 2a of the conductor layer 2 which upper surface is not covered with the plating resist 25, metals such as copper, nickel, gold, etc., are consecutively plated as required, to form a plating layer 5 which is to constitute the pad 4. In this case, the upper surface of the conductor layer 2 on which the plating layer is applied has a small roughness as described above, so that the upper surface of the pad is sufficiently flat even if the plating layer has a small thickness as compared with the counterpart of prior art (see FIG. 5D).

Then, the plating resist 25 is removed, e.g., with an alkali solution (see FIG. 5E), and then, with using the pad 4 as an etching resist, the plating resist is removed from the upper surface of the conductor layer 2 in a circuit pattern region. The upper surface from which the plating resist is removed (i.e., upper surfaces of the resin inflow prevention portion 2b and the resin layer formation portion 2c) is roughened to have a surface roughness larger than the roughness of the above connecting pad disposition portion 2a (see FIG.5F). Specifically, the surface roughness thereof is preferably 0.5 to 10 μm, particularly preferably 1 to 5 μm, as described already. When the above surface roughness is less than 0.5 μm, the resin inflow prevention effect is not sufficient. When the surface roughening is carried out to excess, not only processing (chemical process in particular) comes to be difficult, but also an edge of a through-hole formed in the wiring board may break.

The above surface roughening is carried out by chemical treatment, e.g., chemical soft etching as described above. Preferably, concave and convex shapes are randomly disposed, and when an average of predetermined areas is calculated, any portion is similarly roughened.

According to the production process of the present invention, the plating layer of which the outer form is controlled by the resist accuracy of a plating resist applied only once is used as an etching resist, so that the form and dimensions of the pad can be finely and accurately determined. Further, since the plating layer is used as an etching resist, only the upper surface of the conductor layer in a wiring region continued to the circumferential portion of the pad can be chemically roughened, so that the bonding of a layer which is bonded with a prepreg, etc., can be increased.

Another embodiment of the process for the production of the wiring board of the present invention will be explained with reference to FIG. 6 hereinafter. The wiring board produced according to the above production process is a type shown in FIG. 4, in which a coating layer 25 is formed in a portion other than the pad 4 on the conductor layer 2.

Figure 6A:
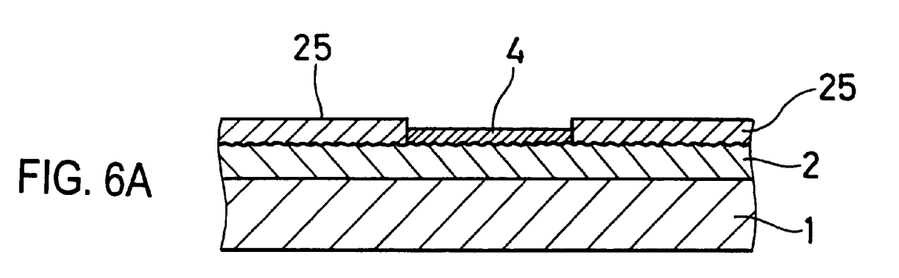
FIGS. 6A and 6B show the process for the production of the wiring board of the present invention shown in FIG. 4.

First, the procedures as shown in FIGS. 5A to 5D are carried out up to the formation of the pad 4 (FIG. 6A). In this case, the plating resist 25 which is to constitute a coating layer preferably has a thickness of 10 to 30 μm.

Figure 6B:
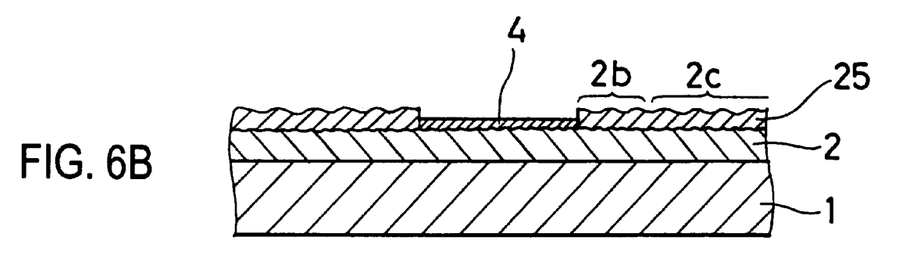

Then, the plating resist 25 is not removed but retained as it is, and the plating resist 25 is surface-roughened (FIG. 6B).

The above coating layer is formed mainly of an epoxy, acrylic, polyimide, urethane or phenolic resin as described above, and preferably, the coating layer is surface-roughened by chemical etching. The chemical etching is carried out, for example, with a high sulfuric acid etching bath or a high chromic acid etching bath. The high sulfuric acid etching bath preferably has a composition of 540 ml/l of sulfuric acid ($H_2SO_4$) and 20 to 30 g/l of anhydrous chromic acid ($CrO_3$), and the etching is preferably carried out by immersion in the above bath having a temperature of 65 to 70° C. for 20 to 30 minutes. The above high chromic acid etching bath preferably has a composition of 400 g/l of anhydrous chromic acid ($CrO_3$) and 200 ml/l of sulfuric acid ($H_2SO_4$), and the etching is preferably carried out by immersion in the above bath having a temperature of 65 to 70° C. for 10 to 15 minutes. In some cases, pre-etching may be carried out prior to the above etching.

When the surface of the coating layer on the conductor layer is used as a resin inflow prevention portion, etc., the resin layer such as a plating resist can be used as a permanent resist, so that the process for the production of the wiring board can be simplified. Further, since the concave and convex portion of the wiring board is filled with the permanent resist, a flatness can be secured.

Further, the resist surface is abraded by the surface roughening carried out for the resin inflow prevention portion, and a highly adhesive filler component contained in the resist is therefore exposed, so that the resin of the resin layer is improved in bonding strength. Further, when a seal is printed on a bonding layer formation portion, a seal-printing agent is improved in adhesion, and the durability against washing is also remarkably improved.

When the resin inflow prevention portion and the resin layer formation portion are formed on the surface of the above coating layer, the coating layer may be surface-roughened by physical treatment so long as it is a physical treatment of a surface roughening type of blowing a medium such sand, etc., since the coating layer is generally formed of a softer material than a metal so that a roughened surface equivalent to the counterpart obtained by the chemical treatment can be obtained. In this case, it is sometimes required to form a protective layer on the pad in advance, for preventing the occurrence of scratches, etc., on the plating surface of the pad caused by the above physical surface-roughening treatment. The protective layer is generally formed of a resin, while a metal mask of stainless steel, nickel, or the like may be used. In this method, however, the surface-roughening step comes to be complicated, and the surface roughening is poor in economic performance as compared with the above chemical surface-roughening.

EXAMPLES

The present invention will be explained further in detail with reference to Examples hereinafter.

Example 1

A wiring board in Example 1 of the present invention was produced according to the production process shown in FIG. 5 as follows.

First, as shown in FIG. 5A, a conductor layer 2 was formed on the upper surface of a substrate 1 which was a dual-side copper clad laminate (CCL-HL830, supplied by Mitsubishi Gas Chemical Co., Inc.) formed by laminating a 18 μm thick copper foil on each side of a 0.5 mm thick BT resin substrate. A circuit pattern having a desired form was to be formed in the conductor layer 2. Then, the entire surface of the above conductor layer 2 was physically roughened with a scrubber. The treatment with the scrubber was intended not only for surface roughening but also mainly for the removal of an oxide film on the surface. The treated surface was measured for a surface roughness to show 0.5 μm. A 20 μm long cross section of the roughened surface was measured for a line length with the foregoing surface form measuring apparatus VF-7500 supplied by Keyence Co., Ltd. to show a vertical line length of 20 μm (1 times) and a horizontal line length of 130 μm (6.5 times).

Then, as shown in FIG. 5C, the surface of the conductor layer 2 other than an electronic-part-connecting pad disposition portion 2a was covered with a plating resist layer 25. The above connecting pad disposition portion 2a was set so as to have an area approximately 10% larger than the size of a chip element to be mounted later. Then, a multi-layer plating layer was formed on the connecting pad disposition portion 2a alone with using the plating resist layer 25. That is, a copper plating layer having a thickness of 10 μm, a nickel plating layer having a thickness of 5 μm and a gold plating layer having a thickness of 1 μm were consecutively laminated, to form a pad 4 (see FIG. 5D).

Figure 5F:
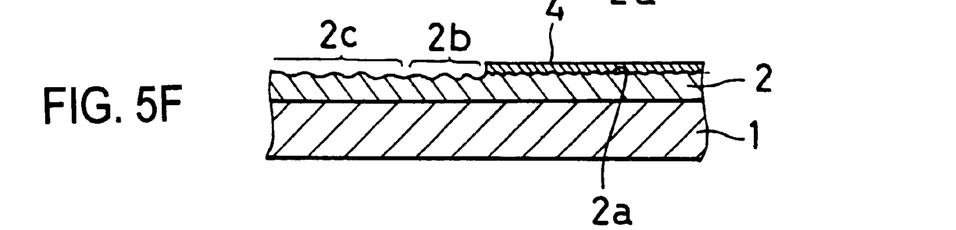

Then, the plating resist 25 was removed with an alkali solution (see FIG. 5E), and then, with using the above pad 4 as an etching resist, a surface of the conductor layer 2 other than the pad 4 (resin inflow prevention portion 2b and resin layer formation portion (2c) was chemically roughened (see FIG. 5F).

The above chemical etching was carried out by heating MECetchBOND CZ-8100 supplied by Mec Co., Ltd. up to 35° C., spraying it to the surface to be etched, at a pressure of 2 kg/cm$^2$ for 1 minute, washing the etched surface with pure water with a pressure sprayer at 1 kg/cm$^2$, acid-washing it with 3.5 wt % hydrochloric acid, washing it with pure water at three stages and drying it with an air knife and a spin dryer. The etched surface was observed through an SEM to show an etched surface having concave portions having various diameters randomly arranged, and it was also measured for a surface roughness to show about 3 $\mu$m. Further, the above 20 $\mu$m long cross section of the roughened surface was measured for a line length to show 152 $\mu$m (7.6 times) in any direction.

Then, an SAW chip was provided as a chip element 10. The SAW chip had a size of 1.5 mm in length and 1.5 mm in width. Metal bumps 11 having a diameter of 100 $\mu$m were attached to the SAW chip.

The chip element 10 was bonded, with its face down, onto the pad 4 of the above-prepared wiring board by ultrasonic bonding with the bumps 11 (that is, a structure shown in FIGS. 1 and 2 was formed).

Finally, a fitting member 30 as a cover was bonded with a prepreg 20. The cover had a thickness of 0.8 mm and was formed of a BT resin, and it had a size of 3.8 mm in length and 3.8 mm in width and had a 0.5 mm deep concave portion for constituting a space in which the chip element 10 was to be housed. The prepreg 20 was arranged so as to have its side face about 300 $\mu$m away from an opposing side face of the pad 4, to leave a resin inflow prevention portion 2b. Therefore, a conductor layer 2 portion present below the prepreg 20 constituted a resin layer formation portion 2c.

As the above prepreg, there was used a 60 $\mu$m thick BT resin GHPL-830NF supplied by Mitsubishi Gas Chemical Co., Inc. The cover was bonded with the prepreg 20 by heating the prepreg at 200° C. under a pressure of 30 kg/cm$^2$ for 2 hours. In this manner, the spreading of a highly flowable component flowed from the prepreg was kept within the range of about 300 $\mu$m which was a width of the above resin inflow prevention portion 2b.

In a wiring board having a conventional structure as shown in FIG. 7, the distance between the outside surface of a chip element and the inside surface of a prepreg was required to be approximately 0.6 mm, which was about twice as large as the counterpart in the present invention. In the conventional wiring board, therefore, the cover was required to have a size of 4.4 mm in length and a 4.4 mm in width, and the area in Example of the present invention was about 25% smaller than the area of the cover in the conventional wiring board.

Example 2

Example 2 is a wiring board example in which a coating layer (permanent resist) was formed around a pad on a conductor layer 2 and the surface thereof was formed into the above resin inflow prevention portion and the above resin layer formation portion. The above wiring board was produced according to the production process shown in FIG. 5 as follows.

First, the procedures as shown in FIGS. 5A to 5D in Example 1 were carried out up to the formation of the pad (FIG. 6A).

Then, a plating resist 25 was not removed but retained as it was, and the surface of the plating resist 25 was chemically etched (FIG. 6B). The above chemical etching was carried out by immersion in a high sulfuric acid etching bath (temperature 65° C.) having a bath composition of 540 ml/l of sulfuric acid (H$_2$SO$_4$) and 20 g/l of anhydrous chromic acid (CrO$_3$) for 20 minutes. The plating resist 25 had a surface roughness of 3.0 $\mu$m.

Then, a fitting member 30 as a cover was bonded onto the above plating resist 25 with a prepreg 20 in the same manner as in Example 1. The prepreg 20 was arranged so as to have its side face about 300 $\mu$m away from an opposing side face of the pad 4, to leave a part of the surface of the plating resist 25 as a resin inflow prevention portion 2b.

In this Example 2, the spreading of a highly flowable component flowed from the prepreg was also kept within the range of about 300 $\mu$m which was a width of the above resin inflow prevention portion 2b.

The above Examples clearly show the effects of the present invention.

What is claimed is:

1. A wiring board having a conductor layer formed on a substrate and a connecting pad disposed in a connecting pad disposition portion provided in part of the conductor layer surface, a resin inflow prevention portion being provided adjacently to said connecting pad disposition portion of the conductor layer, the resin inflow prevention portion having a surface roughness greater than the surface roughness of said connecting pad disposition portion.

2. The wiring board of claim 1, wherein a resin layer formation portion is provided adjacently to said resin inflow prevention portion of the conductor layer, and the resin layer formation portion has a surface which is nearly the same as the resin inflow prevention portion in surface state.

3. The wiring board of claim 1, wherein said connecting pad disposition portion of the conductor layer and a surface of the resin inflow prevention portion of the conductor layer are nearly on the same level.

4. The wiring board of claim 2, wherein the connecting pad disposition portion of the conductor layer has a physically roughened surface and at least the resin inflow prevention portion of the resin inflow prevention portion and the resin layer formation portion has a chemically roughened surface.

5. The wiring board according to claim 1, wherein an electronic part which involves mechanical vibration is mounted on said connecting pad.

6. A wiring board having a conductor layer formed on a substrate, a connecting pad disposed in a connecting pad disposition portion provided in part of the conductor layer surface and a coating layer formed on a surface around the connecting pad disposition portion of the conductor layer, a resin inflow prevention portion being provided on the coating layer adjacently to said connecting pad disposition portion of the conductor layer, the resin inflow prevention portion having a surface roughness greater than the surface roughness of said connecting pad disposition portion.

7. The wiring board of claim 6, wherein a resin layer formation portion is provided adjacently to the resin inflow prevention portion on the coating layer, and the resin layer formation portion has a surface which is nearly the same as the corresponding resin inflow prevention portion in surface state.

8. The wiring board of claim 7, wherein the connecting pad disposition portion of the conductor layer has a physically roughened surface and at least the resin inflow prevention portion of the resin inflow prevention portion and the resin layer formation portion has a chemically roughened surface.

9. The wiring board of claim 6, wherein an electronic part which involves mechanical vibration is mounted on said connecting pad.

10. A process for the production of a wiring board having a conductor layer formed on a substrate and a connecting pad formed of a plating layer on part of said conductor layer, the process comprising:
- a pad formation step of selecting a metal which can work as an etching resist when said conductor layer is chemically surface-roughened, and metal-plating part of an upper surface of said conductor layer to form at least an uppermost portion of said connecting pad with the selected metal, and
- a chemical surface-roughening step of chemically roughening an upper surface of said conductor layer located around said connecting pad and not plated with said connecting pad, using said connecting pad as an etching resist, to form on said upper surface of said non-plated conductor layer around said connecting pad a greater roughness than the upper surface roughness of said conductor layer plated with said connecting pad.

11. The process of claim 10, wherein the conductor layer is formed of copper and the metal forming at least the uppermost portion of the connecting pad is gold.

12. A process for the production of a wiring board having a conductor layer formed on a substrate, a connecting pad formed of a plating layer on part of said conductor layer and a coating layer formed around said connecting pad on said conductor layer, the process comprising
- a pad formation step of selecting a metal which is not surface-roughened by chemical surface-roughening when said coating layer is chemically surface-roughened, and metal-plating part of an upper surface of said conductor layer to form at least an uppermost portion of said connecting pad with the selected metal, and
- a chemical surface-roughening step of chemically roughening an upper surface of said coating layer such that an upper surface of said coating layer has a greater roughness than an upper surface of said conductor layer plated with said connecting pad.

13. The process of claim 12, wherein the conductor layer is formed of copper and the metal forming at least the uppermost portion of the connecting pad is gold.

* * * * *